Dec. 24, 1968 A. C. BRADHAM III 3,418,422

ATTACHMENT OF INTEGRATED CIRCUIT LEADS TO PRINTED CIRCUIT BOARDS

Filed Feb. 28, 1966

United States Patent Office 3,418,422
Patented Dec. 24, 1968

3,418,422
ATTACHMENT OF INTEGRATED CIRCUIT LEADS TO PRINTED CIRCUIT BOARDS

Allen Craven Bradham III, Houston, Tex., assignor to Texas Instruments Incorporated, Dallas, Tex., a corporation of Delaware Filed Feb. 28, 1966, Ser. No. 530,607
3 Claims. (Cl. 174—94)

ABSTRACT OF THE DISCLOSURE

Disclosed are (1) a method of attaching integrated circuits to printed circuit boards with Kovar leads covered with an alloy of electroless nickel and electroless gold and (2) the resulting junctions between integrated circuit leads in the printed circuit boards.

Figures 1, 2:
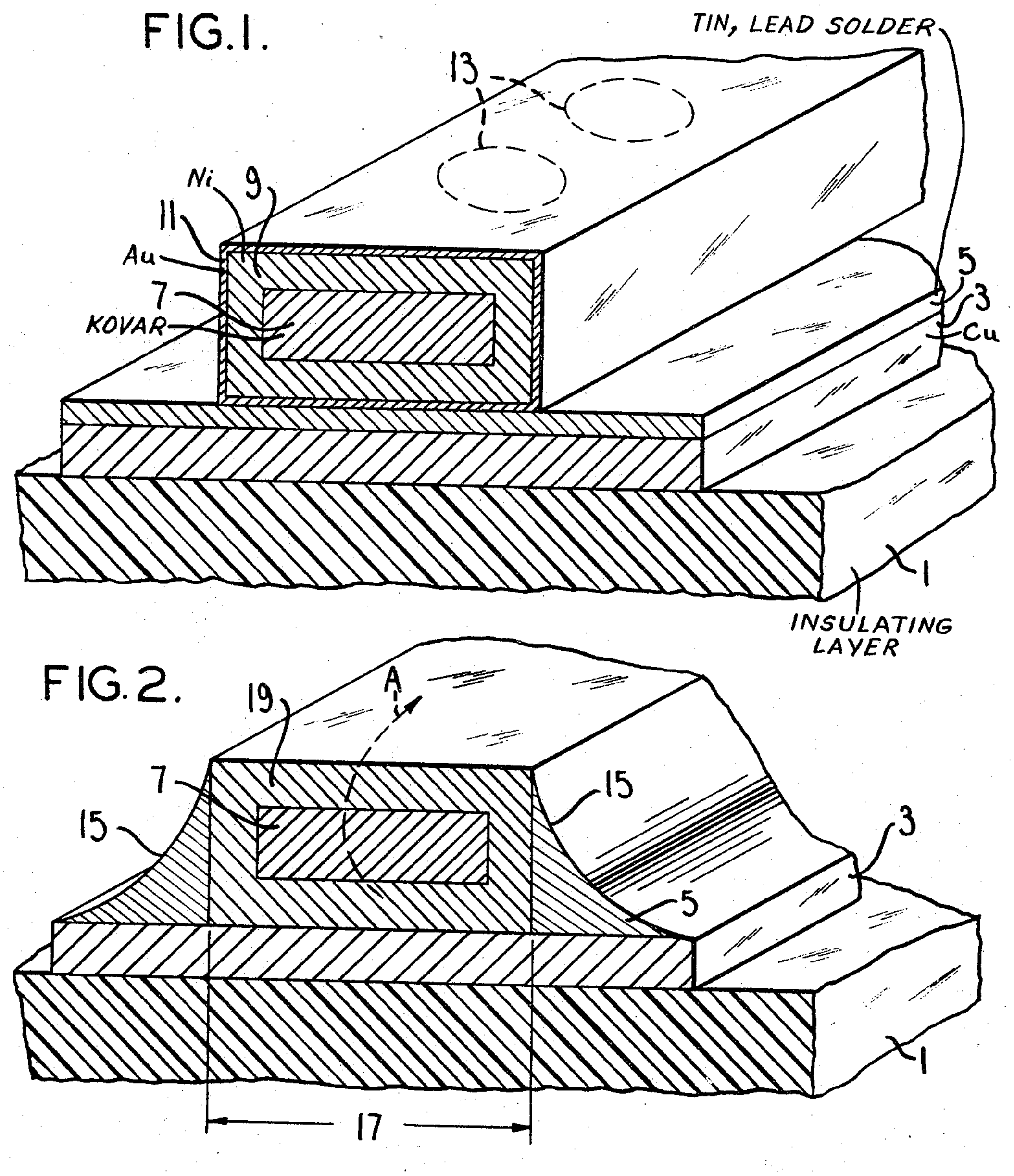

This invention relates to the attachment of integrated circuits to printed circuit boards, and with regard to certain more specific features, to the bonding of Kovar leads of such circuits to printed circuit-forming copper foils on such boards to form improved electrically conductive junctions.

Among the several objects of the invention may be noted the provision of rapid, economical and reliable means for making strong electrically conductive attachments of Kovar leads of integrated circuits to copper foil on circuit boards, without damage to the foil or the lead; the provision of improved soldering means for making such attachments which requires no fluxing agents and minimizes the amount of solder required; the provision of means of the class described with which may be successfully employed available parallel-gap welding electrodes to provide resistance heating for either automatic or manually controlled soldering sequences; and the provision of means of the class described which will produce easily inspectable strong bonds which, however, without damage to the foil may be conveniently released for field repairs. Other objects and features will be in part apparent and in part pointed out hereinafter.

The invention accordingly comprises the methods and features of construction which will be exemplified in the methods and products hereinafter described. The scope of the invention will be indicated in the following claims.

In the accompanying drawing, in which one of various possible embodiments of the invention is illustrated:

FIGURE 1 is a greatly enlarged diagrammatic cross section (not to scale) illustrating, for example, the aplication of one circuit lead of an integrated circuit to a solder-covered part of a printed circuit foil of a circuit board, prior to formation of an attachment between the lead and the foil; and FIGURE 2 is a greatly enlarged sectioned perspective view (not to scale) illustrating a finished attachment between an integrated circuit lead and a part of a printed circuit on a printed circuit board.

Corresponding reference characters indicate corresponding parts in the two views of the drawing.

Referring to FIGURE 1 of the drawing, numeral 1 indicates part of an insulating layer constituted by an appropriate circuit board. Such boards are known in the art and require no further detailed description. On the board 1 is attached in the usual manner the thin printed copper circuit foil, a part of which appears at 3. The foil has a conventional thickness of a few thousandths of an inch, for example. Numeral 5 indicates an electroplated layer of a 60:40 tin-lead solder located on the foil 3. The solder may be electroplated on the foil 3 before or after the foil takes its final circuit-forming shape.

At numeral 7 is shown one conventional small Kovar core in the form of a lead of an integrated circuit (the latter not further shown, being known). Kovar is a proprietary name for an alloy consisting of approximately 20% to 29% nickel, 17% cobalt, 0.2% maganese and the balance iron. Its use as leads for integrated circuits is dictated by the fact that its coefficient of expansion is substantially the same as that of certain glasses used as insulation in connection with integrated circuits and through which the leads extend. The lead 7 has the usual cross section measuring a few thousandths of an inch on each side. Each integrated circuit has several leads for attachment to various parts of a printed circuit. Only one lead is illustrated, since the invention is equally applicable to all of them.

Electrolessly plated on the Kovar lead 7 is a thin layer 9 of electroless nickel. Electrolessly plated on the electroless nickel 9 is a thinner layer of electroless gold 11. The dotted circles on FIGURE 1, numbered 13, indicate locations where a pair of parallel-gap electrodes may be applied to a lead for applying current for heating.

Heretofore, unsuccessful attempts have been made to weld or braze gold-covered Kovar leads such as 7 of integrated circuits to the copper foil such as 3 of printed circuitry. Such leads, demonstrating unsuccessful weldability, were electroplated first with Watts nickel to a thickness of 70 microinches and then further electroplated with a covering of gold to a thickness of 125 microinches. The primary purpose of this combination of Watts nickel and gold plating is to facilitate the manufacture of the integrated circuit and not necessarily to facilitate its assembly by brazing or welding to printed circuitry. Leads, thus prepared, were contacted directly with the copper foil such as 3 when parallel-gap welding electrodes were applied. The results were unreliable for the reason that copper melts at 1083° C. and gold at 1063° C. Thus to melt the gold, required for making bonds to copper circuitry, necessitated the gold reaching a temperature within 20° C. of the melting point of copper. With ordiary controls for the welding current, this temperature of 1063° C. was so close to 1083° C. that temperature overshoot to 1083° C. often occurred, resulting in excessive melting of the copper and the formation in the copper foil of what is sometimes called a blowout, or a burnout. Such blowouts or the like made connections useless which often could not be seen upon inspection. Moreover, even though a few good welds might be obtained by excessively close control of welding parameters, the Kovar lead, once welded to the printed copper circuit, could not readily be removed or stripped from the copper for repairs in the field.

Referring again to FIGURE 1, the invention for example includes electroplating 60:40 tin-lead solder 5 on the copper circuit foil 3. A typical range for the thickness of the solder is approximately 300 to 500 microinches, inclusive, with 400 microinches preferred.

The Kovar lead 7 is electrolessly plated with the nickel 9, i.e., by chemical means rather than by electroplating. Electroless plating of nickel is known and requires no further description. Nickel which is chemically plated is generally known in the art as electroless nickel. It melts at approximately 890° C. A satisfactory range of thickness of the electroless nickel 9 is approximately 120 to 165 microinches, inclusive, with 150 microinches preferred.

Over the electroless nickel 9 is electrolessly, i.e., chemically, plated the gold 11 within a range of approximately 30 to 60 microinches, inclusive, with 30 microinches preferred. Electrolessly plated gold is known as electroless gold. There are various electroless or chemical processes known in the art for plating the electroless nickel and electroless gold. Further description is therefore unnecessary, except that as to the electroless gold the process described in Patent No. 3,123,484 is preferred because of its ability easily to build up the desired thickness of gold, namely, 30 to 60 microinches. Such thicknesses provide sufficient gold 11 with the underlying electroless nickel to form upon heating a substantial amount of a gold-nickel alloy. The alloy forms approximately in the range of 850° C. to 900° C., inclusive. However, according to the invention the amount and thickness of the nickel are in excess, rather than the amount and thickness of the gold.

To make an attachment, the Kovar lead 7, which has been electrolessly plated as described above, with the electroless nickel 9 and electroless gold 11 is placed against the electroplated solder 5 on the foil 3. It is held in engagement by current-carrying parallel-gap electrodes applied at areas 13 for parallel-gap application of current.

The electroless gold 11 and the electroless nickel 9 in excess form a solid solution type of alloy which normally has a minimum melting point of 950° C. However, since the electroless nickel melts at 890° C. due to the phosphorus present, the gold will be dissolved at this temperature or below. Thus the bond may be readily formed in the temperature range of approximately 850° C.–900° C., a range well below the melting point of copper, 1083° C. In this temperature range the electroplated solder 5 on the foil 3 quickly melts, its melting point being approximately 182° C. The melted solder flows up on the lead 7, which upon cooling makes reliable fillet connections at 15, as illustrated in FIGURE 2. Solder flow occurs in a temperature range, which extends well under the 1083° C. melting point of copper. Therefore, welding conditions need not be maintained so precisely constant in order to prevent melting of the copper foil 3 while the solder is being melted. This is a great advantage under conditions of rapid production.

In view of the above, it will be seen that the lead 7 is plated with materials which heat rapidly to temperatures in the range of 850° C. to 900° C. sufficiently high to cause solder flow (at about 182° C.) and yet not so high (1083° C.) as to risk overheating and melting of the underlying copper foil 3. The formation of the nickel-gold alloy also acts as a good heat-distribution medium to distribute heat quickly and evenly to the solder and to accelerate good wetting of the lead by the solder such as is required to make a good soldered connection. The solid electroless nickel and electroless gold which ultimately form the alloy before welding are carried dry on the leads. Thus with these dry materials on the leads, they and the integrated circuits which carry such leads may be stored indefinitely without deterioration, ready for attachment. Also, when soldering occurs, no wet fluxing agent is required. Nevertheless, good solder flow and adhesion are obtained upon applying current for heating.

Summarizing, by plating the lead 7 with the stated materials, heating is rapid to high temperatures sufficient to cause solder flow and yet not so high as to endanger overheating of the copper foil underneath. This overheating danger is minimized by the large temperature margin (183–233° C.) between the melting point of copper (1083° C.) and the temperature of formation of the alloy (850° to 900° C.). Moreover, the electroless gold 11 not only forms the alloy with the nickel 9 but decreases the electrical contact resistance to a low level for starting the melting process at low electrode voltages.

It will be observed that the thickness and amount of the electroless nickel are large as compared to the thickness and amount of the electroless gold. Thus it has the major influence on the melting temperature of the plating which is approximately 890° C., rather than closer to the melting point of gold, which is 1063° C. Thus repeatability of successful attachments is assured. Moreover, the nickel-gold alloy, acting as a rapid heat transfer medium, very rapidly distributes heat to melt the solder 5 to cause good wetting. While the nickel-gold alloy has some ability to act as a brazing material between the Kovar lead 7 and the copper foil 3 as melted lead is squeezed out from between them during application of the electrodes, this brazing effect is minimal but for that reason constitutes an advantage. Thus the primary normally effective strength of the joint lies in the fillets 15. This strength, added to the strength of the smaller brazing effect, is adequate for normal use of the attachment between the lead 7 and the foil 3. But if it is desired to remove a lead 7 from the foil 3, it can readily be accomplished, since there is not a very strong brazed or soldered connection between the lead 7 and the foil 3 in the area bracketed at 17. Release occurs easily without substantially damaging the printed circuit foil 3 itself. It will be observed from FIGURE 2 that the alloy, there numbered 19, has been left in a thin layer on the surfaces of the lead 7, having been held thereto by cohesion while melted and afterward solidified. Although mechanical strength is limited over the span 17, there is excellent electrical contact. The main normal mechanical strength lies in the fillets 15 but from which the lead 7 may readily be stripped by pulling it back at about a 180° angle. The dotted dart A on FIGURE 2 suggests this. It will be understood that some heat may be applied during pulling to soften the solder, but this is not always necessary.

Advantages of the invention are as follows:

(1) No flux is required to be added to the leads in order to cause solder to attach to them, and no added solder is required for pretinning the leads.

(2) A primarily soldered joint is quickly formed in approximately 7 to 10 milliseconds compared to about 3 seconds required by other soldering processes. This permits a rapid machine cycle for ordinary application of electrodes in sequence to a multiplicity of leads 7 on a printed circuit.

(3) Conventional parallel-gap welder electrodes may be used, such as are otherwise employed for welding leads on nickel foil.

(4) The joints are strong in normal usage, but can be easily opened or released for field repairs without damage to the foil.

(5) The joints are readily inspectable for effectiveness since the primary item that needs to be examined is the proper formation of the readily visible fillets 15.

(6) Without excessively critical control of the parameters for the heating welding current, successful connections can be reliably obtained under automated conditions for rapidly applying the electrodes to one lead after another on a circuit board, without any substantial danger of copper burnouts.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

What is claimed is:

1. A junction between an electrically conductive lead comprising approximately 20%–29% nickel, 17% cobalt, 0.2% manganese and the balance iron, and a solder-covered conductive copper foil on a circuit board, comprising an electroless nickel gold alloy between the lead and the foil, said alloy forming an electrically conductive brazed connection therebetween, and transversely spaced solder fillets joining the foil and the sides of the lead.

2. A junction between an integrated circuit lead comprising approximately 20% to 29% nickel, 17% cobalt, 0.2% manganese and the balance iron and a thin copper printed circuit foil attached to a circuit board, comprising an electroless nickel and electroless gold alloy between the lead and the foil, the nickel constituent of the alloy being in excess of its gold constituent, said alloy forming a brazed connection between the lead and the foil, and transversely spaced tin-lead solder fillets joining the foil and the sides of the lead, the combined holding strength of the fillets and of the brazed connection being substantial, with the latter connection minimal in strength.

3. A junction according to claim 2, wherein the copper foil is meltable at approximately 1083° C., the alloy is meltable in the range of from 850° C. to 900° C., inclusive, and the solder is meltable at approximately 182° C.

References Cited

UNITED STATES PATENTS 3,271,625 9/1966 Caracciolo.

DARRELL L. CLAY, *Primary Examiner.*

U.S. Cl. X.R.

317—101; 29—626; 174—68.5; 339—275